United States Patent [19]

Gulczynski

[11] Patent Number: 4,871,980
[45] Date of Patent: Oct. 3, 1989

[54] HIGH EFFICIENCY POWER AMPLIFIER COMPRISING MULTILEVEL POWER SUPPLY

[76] Inventor: Zdzislaw Gulczynski, P.O. Box 441, Winchester, Mass. 01890

[21] Appl. No.: 180,433

[22] Filed: Apr. 12, 1988

Related U.S. Application Data

[63] Continuation-in-part of Ser. No. 27,561, Mar. 18, 1987, Pat. No. 4,782,306.

[51] Int. Cl.$^4$ .......................... H03F 3/68; H03F 3/45
[52] U.S. Cl. ...................................... 330/295; 330/255
[58] Field of Search ............... 330/297, 262, 255, 295, 330/311, 267, 268, 151

[56] References Cited

U.S. PATENT DOCUMENTS 4,782,306 11/1988 Gulczynski .......................... 330/262

Primary Examiner—Gene Wan

[57] ABSTRACT

The analog power amplifier (PA) is particularly for a closed loop signal amplification requiring high output power, high efficiency, high speed, wide operating temperature range and a low number of components. The high efficiency is obtained thru an employment of multiple PAs and a nonlinear amplifier which completely eliminates controllable power switches. No thermal compensation and no matching of the output transistors, and no adjustments are necessary.

A nonlinear amplifier amplifies an input signal and provides a plurality of interim signals each having a different transfer function with respect to the input signal. PAs separately amplify each of the interim signals and provide at least a portion of an output signal of the entire PA. The nonlinear amplifier includes a plurality of diode circuits for determining the transfer functions of the interim signals so that the output current takeover by the individual PAs is smooth.

15 Claims, 3 Drawing Sheets

HIGH EFFICIENCY POWER AMPLIFIER COMPRISING MULTILEVEL POWER SUPPLY

CROSS REFERENCE TO RELATED INVENTIONS

This application is a continuation-in-part of prior application Ser. No. 027,561 filed on 03/18/87 and entitled "Power Amplifier", now U.S. Pat. No. 4,782,306 dated 11/01/88.

This application is also related to: "Ultra Fast Logic" Ser. No. 180,432 filed on even date herewith; "Analog Power Amplifier" Ser. No. 180,432 filed on even date herewith; "High Speed Instrumentation Amplifier with Minimized Offset Voltage and Drift" Ser. No. 180,434 filed on even date herewith; "Switching Power Amplifier" U.S. Pat. No. 4,763,080 dated 08/09/88; "Operational Amplifier" U.S. Pat. No. 4,749,958 dated 06/07/88; "Operational Amplifier or Comparator Circuit with Minimized Offset Voltage and Drift" U.S. Pat. No. 4,749,953 dated 06/07/88; "Operational Amplifier" U.S. Pat. No. 4,714,894 dated 12/22/87; "Operational Amplifier" U.S. Pat. No. 4,634,996 dated 01/06/87; and "Push-Pull Power Amplifier" U.S. Pat. No. 4,476,441 dated 10/09/84. All inventions are by the same inventor.

BACKGROUND OF THE INVENTION

The invention relates to an analog power amplifier (PA), particularly for a closed loop signal amplification requiring high output power, high efficiency, high speed and wide operating temperature range.

Power amplifiers are devices designed to amplify an input signal and provide an undistorted power output signal, i.e. an alternate current within a wide range of an output voltage; independent of supply voltages, load fluctuations over frequency, operating temperature, etc. The parameters such as input impedance, input offset voltage or open loop gain are not essential.

A thermal compensation in conventional PAs, simple in principle, is very inaccurate, unreliable and difficult to accomplish; it demands temperature compensation of at least two complementary high power transistors by means of floating low power components thermally coupled thereto. Crossover distortions are minimized by excessive quiescent current causing an extensive power dissipation even with no load. The quiescent current must be adjusted manually, whereby its stability is very poor.

A matching of power transistors is laborious and troublesome, and in case of MOSFETs very difficult to achieve. Furthermore, the temperature coefficient of the MOSFET's gate-source voltage varies in a very wide range and has a zero value at a drain current mostly much higher than a desired quiescent current. Collectors or drains of the transistors, coupled to the cases thereof during a manufacturing process, are on different potentials. Insulating wafers introduce large parasitic capacitances and increase thermal impedance keeping individual devices at more uneven temperature.

The output voltage swing is reduced by the base-emitter or gate-source voltages of the power transistors which can be significant for high output currents and is generally very high for power MOSFETs. In order to improve the stability and accuracy of the quiescent current and minimize the likehood of thermal runaway of the power transistors, power resistors coupled is series with the load are used.

The efficiency is improved by providing a multiple level power supply. The supply voltage of the PA is switched to different values according to the output signal level, usually by means of power switches. The transition must occur at a relatively high voltage across a corresponding power transistor of the amplifier in order to prevent its saturation. The instant voltage switching at a high output current puts an enormous stress on the power transistors designed for a signal amplification, and degrades their long-term reliability. Moreover, the distortion level of the PA is significantly higher due to the switching.

SUMMARY OF THE INVENTION

The invention is intended to solve the above problems and therefore the object of the invention is to provide a PA having high output power, high efficiency, high speed, wide operating temperature range and a low number of components. According to the invention the high efficiency is obtained thru an employment of multiple PAs, some of which can be greatly simplified, and a nonlinear amplifier which completely eliminates controllable power switches.

The input signal of the PAs is limited to threshold voltages. Thereby, the saturation of output transistors of the PAs can be prevented by setting suitable gains thereof. The output current take-over by the individual PAs is smooth which obviates quiescent currents of large signal PAs. The output voltage swing is inherently very high as the base-emitter (or gate-source) voltages of the output transistors are not essential due to the common emitter (or common source) configuration thereof. Furthermore, the output transistors can be assembled on a common heat sink without insulating wafers. No thermal compensation and no matching of the output transistors, and no adjustments are necessary.

A PA according to the present invention comprises a nonlinear amplifier means for amplifying an input signal of the power amplifier and providing a plurality of interim signals each having a different transfer function with respect to the input signal, and power amplifier means for separately amplifying each of the interim signals and providing at least a portion of an output signal of the power amplifier. The nonlinear amplifier means may include a plurality of diode means for determining the transfer functions of the interim signals.

BRIEF DESCRIPTION OF THE DRAWINGS

The present invention will become more clear in conjunction with the accompanying figures of which.

DETAILED DESCRIPTION OF THE INVENTION

Figure 1:
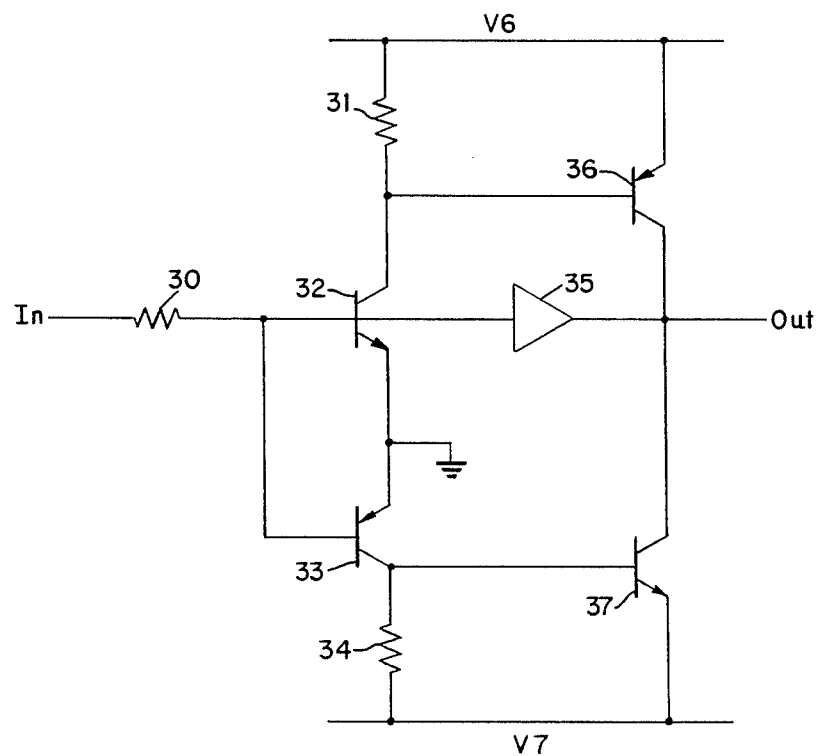
FIG. 1 is the embodiment of the high efficiency PA comprising a 4-level power supply, as disclosed in the aforementioned U.S. Pat. No. 4,782,306 by the same inventor.

FIG. 1 is the embodiment of the high efficiency PA as disclosed in the aforementioned U.S. Pat. No. 4,782,306 by the same inventor. The PA comprises 4-level power supply, whereas the two supply voltages of the PA 35 are not shown for simplicity.

The circuit contains a nonlinear amplifier and a pair of PAs, one of which is greatly simplified as it consists of just two transistors, whereby each transistor can be considered as a separate PA. The nonlinear amplifier amplifies the input signal of the PA and provides a plurality of interim signals, further separately amplified by the PAs. The outputs thereof are coupled together for combining the amplified interim signals into a single output signal of the PA.

The input signal of the PA is applied to the nonlinear amplifier which comprises the resistors 30, 31 and 34, and the transistors 32 (npn) and 33 (pnp). The emitters thereof are connected to ground. The bases thereof are tied to the resistor 30, and the collectors thereof are coupled to the supply voltage sources V6 and V7 via the resistors 31 and 34 respectively, and provide a pair of outputs of the nonlinear amplifier. The input and a third output thereof are the separate ends of the resistor 30. The collectors of the transistors 32 and 33 are connected to the bases of the transistors 36 (pnp) and 37 (npn) respectively. The emitters of the transistors 36 and 37 are coupled to the respective supply voltage sources V6 and V7 which extend the output voltage range of the entire circuit.

The nonlinear amplifier includes therefore a plurality of diode means for determining the transfer functions of the interim signals. In particular, the transistors 32 and 33 act as diodes for limiting one interim signal, and as separate nonlinear amplifiers with a diode input characteristic and a corresponding transfer function for the two other interim signals. Thereby, the diode means provide separate interim signals below, within and above a predetermined range according to the voltage level of the input signal. Generally, the diode means include source means, which is ground in the FIG. 1 embodiment, for determining a range of the respective interim signal. The resistor 30 is coupled in series with the input signal of the PA for providing one interim signal, further limited by the diode means coupled to ground.

At a threshold voltage, approximately equal to the base-emitter voltage of the transistor 32 or 33, an increasing input signal results in a greatly increasing collector current of one of the transistors 32 or 33, and only slightly increasing input voltage of the PA 35. The collectors of the transistors 36 and 37 are coupled together for providing the output signal for higher output voltages. Thus, voltages outside the supply voltage range of the PA 35 are applied to the output thereof. A necessary protection circuit may simply consist of diodes, each coupled in series with an output transistor of the PA 35.

Examples of PAs with such a protection are disclosed in the aforementioned U.S. Pat. No. 4,782,306 and the application entitled "Analog Power Amplifier" filed herewith. High efficiency power supply is recommended for providing V6, V7, positive and negative supply voltages of the PA 35. High efficiency power supplies are disclosed in "Switching Power Supply" U.S. Pat. No. 4,803,610 dated 02/07/89 and "Switching Power Supply" now U.S. Pat. No. 4,736,286 issued on 04/05/88. All inventions are by the same inventor.

The linearity of the transfer function can be improved by matching the gains of the PA 35 and the remaining PA. The technique of nested loops can be employed.

An operational amplifier can be used as an input stage of the PA 35 for setting its gain to an accurate value. Similarly, a plurality of PAs can be used, each having separate supply voltages and an output coupled to the output of the entire circuit. A nonlinear amplifier having a single input and plurality of outputs can control the transfer of the input signal to separate PAs so that each receives a smaller or bigger part of the input signal according to the level thereof. It shall be pointed out that only one PA requires a short circuit protection.

The input signal of the PA 35 is limited to the positive and negative threshold voltages. Thereby, the saturation of output transistors of the PA 35 can be prevented by setting a suitable gain thereof so that the output current take-over by the individual PAs is smooth. The saturation would impair speed, linearity, stability, etc. During the transition phase the transistor 36 or 37 and the respective output transistor of the PA 35 conduct, wherein no instant change of their output currents takes place. This also obviates quiescent currents of the transistor 36 or 37. The output voltage swing is inherently very high as the base-emitter voltages of the transistors 36 and 37 are not essential due to the common emitter configuration thereof. Furthermore, the transistors 36 and 37 can be assembled on a common heat sink without insulating wafers.

Figure 2:
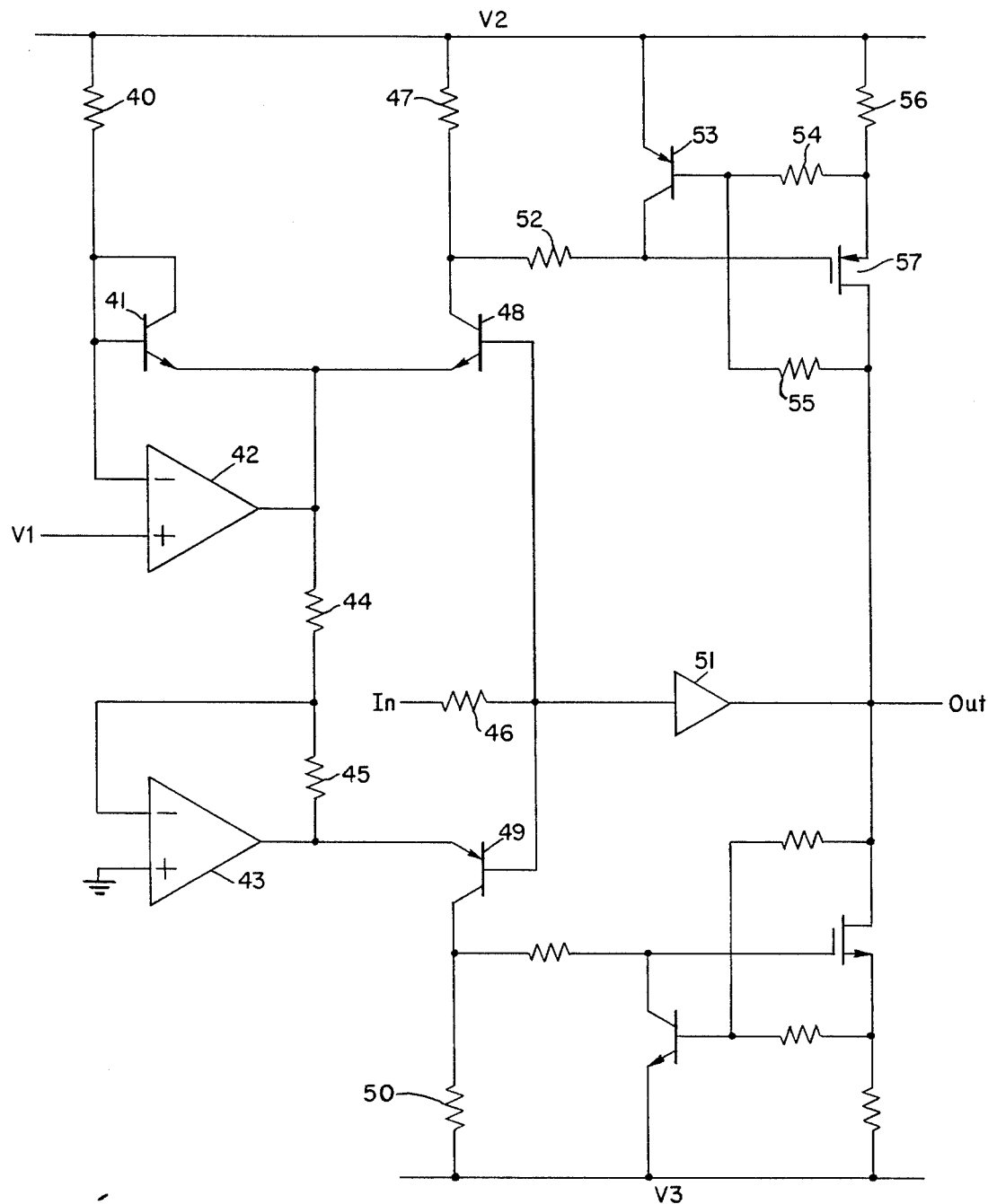
FIG. 2 is the preferred embodiment of the PA comprising 4-level power supply, temperature compensated nonlinear input amplifier and extended short circuit protection for loads with reactive portion.

FIG. 2 is the preferred embodiment of the PA comprising 4-level power supply, temperature compensated nonlinear amplifier and extended short circuit protection for loads with reactive portion. The input signal of the PA is applied to the nonlinear amplifier which comprises the components 40 thru 50. The components 46 thru 50 are coupled and operate as the respective components 30 thru 34 of FIG. 1. However, the emitters of the transistors 48 (npn) and 49 (pnp) are coupled to the outputs of the operational amplifiers (OA) 42 and 43 respectively. The PA input signal is applied to one end of the resistor 46. The other end thereof and the collectors of the transistors 48 and 49 provide the interim signals of the nonlinear amplifier. The supply voltage sources V2 and V3 extend the output voltage range of the entire circuit and correspond to respectively V6 and V7 of FIG. 1.

The positive threshold of the nonlinear amplifier is substantially equal to the positive voltage of the source V1 coupled to the noninverting input of the OA 42. Coupled to the inverting input and output thereof are respectively the base and emitter of the npn transistor 41. The collector current thereof depends on the voltages of V1 and V2, and is set by the resistor 40 coupled between V2 and inverting input of the OA 42. The transistor 41 has base and collector tied together and operates as a diode to compensate for the base-emitter voltage of the transistors 48 and 49. A thermal coupling of the transistors 48 and 41 may be sufficient as the operating conditions of the transistors 48 and 49 are very similar. The thermal compensation is easy attainable as it applies to low power devices.

The negative threshold of the nonlinear amplifier is obtained by means of the ordinary inverting amplifier comprising the OA 43 and a pair of resistors 44 and 45. Equal values thereof result in opposite polarities and equal values of the positive and negative threshold voltages. Generally, the diode means include source means for determining a range of the respective interim signals. In particular, the emitters of the transistors 48 and 49 are coupled to the outputs of the OA 42 and 43 respectively which exhibit low output impedances.

The interim signals of the nonlinear amplifier are separately applied to the input of the PA 51 and two other PAs. For simplicity, only one of these two PAs is described hereinbelow due to a symmetrical operation and configuration thereof, as clearly shown. The one PA comprises the p-channel MOSFET 57 and the optional components 52 thru 56 constituting a short circuit protection. The gate of the transistor 57 is coupled to the collector of the transistor 48 via the resistor 52 for obtaining the respective interim signal and its drain provides a respective portion of the PA output signal.

The short circuit protection is accomplished by sensing an excessive drain current of the transistor 57 and limiting the interim signal applied thereto. A resistor coupled anywhere in the drain-source path of the transistor 57 can be used. The resistor 56 coupled between V2 and the source of the transistor 57 is shown. A too high output current of the PA provided by the transistor 57 results in a collector current of the pnp transistor 53, further limiting the gate-source voltage of the transistor 57. The emitter and collector of the transistor 53 are coupled to the source V2 and gate of the transistor 57 respectively.

The base of the transistor 53 is coupled to the resistor 56 via an optional resistor network for sensing the voltage at the drain, which provides the respective portion of the PA output signal, and accordingly determining the excessive current. Specifically, the resistors 54 and 55 are coupled to the base of the transistor 53 and weight respectively the voltage across the resistor 56 and the PA output voltage increased by the voltage of V2, with reference to V2. Thereby, the base-emitter voltage of the transistor 53 depends on the drain current of the transistor 56 and the PA output voltage. The short circuit current will decrease with increasing drain-source voltage of the transistor 57 so that an operation within the safe operating area (SOA) thereof can be determined. Nonlinear components, such as zener diodes, can be employed for sensing the PA output voltage and more accurately determining the excessive current within the SOA.

The connection of the resistor 56 to the supply voltage source V2 is preferred. A more accurate short circuit current can be easy obtained by means of an OA sensing the excessive drain current of the transistor 57. Specifically, a noninverting input of the OA can receive a fixed voltage with reference to V2, and its inverting input and open collector output can be coupled like respectively the base and collector of the transistor 53. It shall be also pointed out that the optional short circuit protection is in addition to a short circuit protection of the PA 51.

Figure 3:
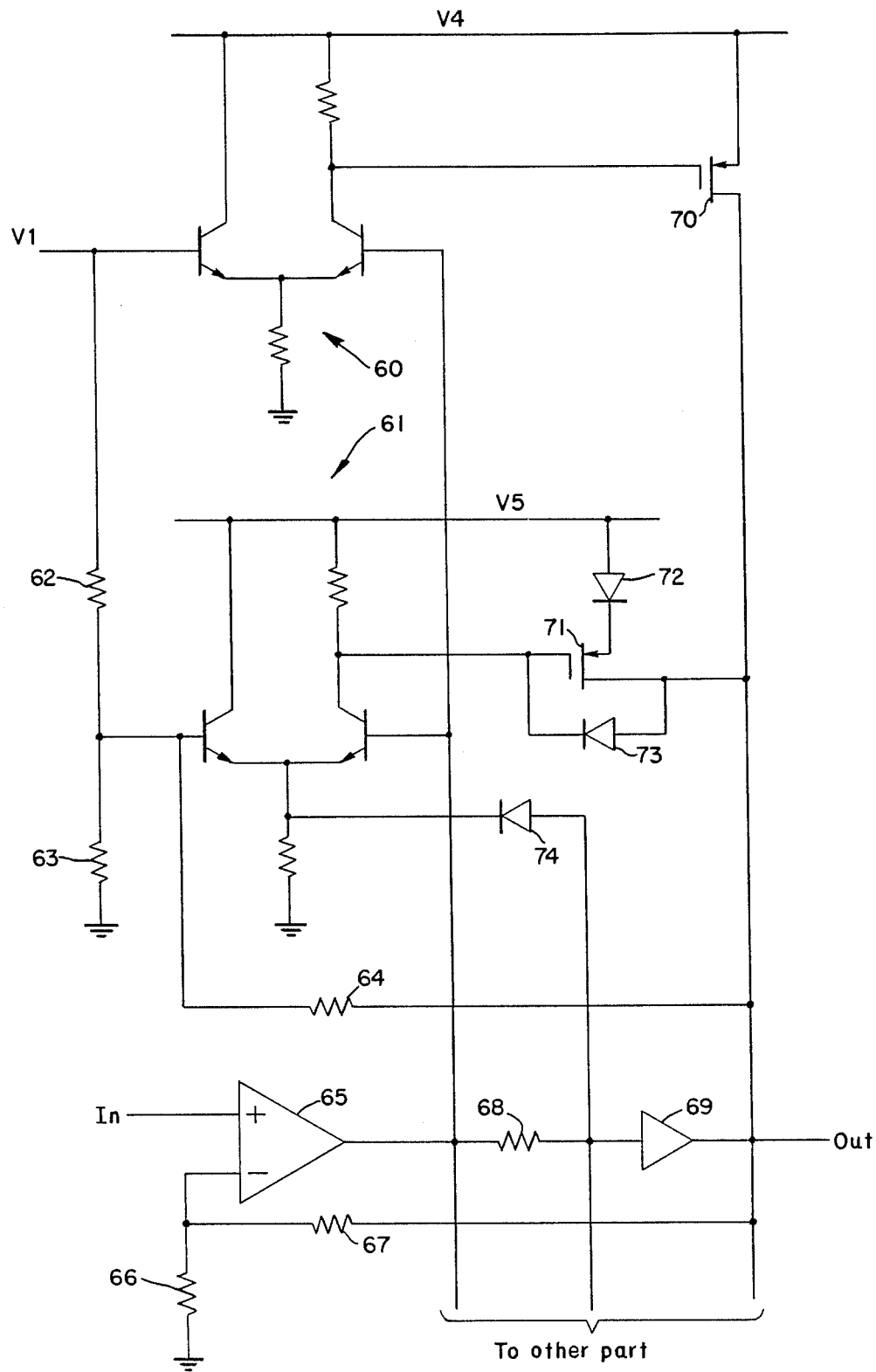
FIG. 3 is another embodiment comprising 6-level power supply, with approximately half of the circuit shown.

FIG. 3 is another embodiment of the PA comprising 6-level power supply. For simplicity, only approximately half of the circuit is shown. The nonlinear amplifier includes the resistor 68, diode 74, a pair of differential amplifiers 60 and 61, and a pair of sources providing reference voltages thereto. The components 65 thru 69 are common to both halves. Each differential amplifier consists of a pair of npn transistors having emitters coupled via a resistor to ground. One of the transistors has the base coupled to the input of the nonlinear amplifier, and the collector coupled via a resistor to a respective supply voltage and providing one of the interim signals of the nonlinear amplifier. The base of the other transistor is coupled to a source which determines the threshold voltage of the respective amplifier.

Specifically, the output signals of the amplifiers 60 and 61 are applied to the gates of the p-channel MOSFETs 70 and 71 respectively. The differential amplifier 60 is supplied from the voltage source V4 and obtains a fixed reference voltage from the source V1. The differential amplifier 61 is supplied from the voltage source V5 and obtains a variable reference voltage. This voltage is obtained by means of a voltage divider sensing the output signal of the PA and consisting of the resistors 62, 63 and 64 coupled to the source V1, ground and the PA output respectively.

In order to prevent a saturation of the transistor 71, the variable reference voltage of the amplifier 61 is smaller and greater than the voltage of V1 for PA output voltages respectively below and above predetermined values set by the resistors 62 thru 64. As a result, with increasing PA output voltage the gate-source voltage of the transistor 71 rises and then falls. Thereby, the drain current of the transistor 71 ceases before the PA output voltage reaches the voltage of V5.

Similarly, one of the interim voltages of the nonlinear amplifier appearing at the input of the PA 69 is limited by the diode 74 coupled thereto and to emitters of the transistors of the differential amplifier 61. Generally, the resistor 68 is coupled in series with the input signal of the PA for providing one of the interim signals, and one of the diode means is coupled to limit the one interim signal. In the FIG. 3 embodiment, the limit is the variable reference voltage of the amplifier 61 since the voltage drop across the diode 74 is compensated by the base-emitter voltage of the respective transistor of the amplifier 61. This specific circuit configuration has been chosen to show another feature of the present invention. An increasing PA output voltage causes a higher reference voltage. However, before the PA output voltage reaches the value of the positive supply voltage of the PA 69 the output current thereof ceases, thus preventing a transistor saturation.

The diode 72 is connected in series with the source of the transistor 71 for preventing a reverse polarity drain current thereof. The diode 73 is coupled between the drain and gate of the transistor 71 for a further protection thereof. Generally, the diode 72 is coupled in the drain-source path of the transistor 71 to conduct the drain current thereof. The diode 72 can be coupled in series with the drain of the transistor 71, whereby the diode 73 is superfluous. However, the drain is then no longer directly connected to the output of the PA.

As mentioned, FIG. 3 shows only approximately a half of the PA, for simplicity. The second half comprises analogous components constituting the same structure and providing negative output voltage of the PA. Specifically, the conductivity types of the semiconductors are opposite. For instance, n-channel MOSFETs are used analogous to p-channel MOSFETs 70 and 71 and the polarity of diodes analogous to 72 thru 74 is reversed. Polarity of voltage sources analogous to V1, V4 and V5 is negative. FIG. 3 shows three lines marked "To other part" which connect both halves.

Common to both halves of the PA are the components 65 thru 69. The positive supply voltage of the PA 69 is smaller than the voltages of V4 and V5. The OA 65 is coupled in series with the PA input signal and its differential inputs separately receive the PA input signal and a portion of the PA output signal. Specifically, the input of the PA is the noninverting input of the OA 65 and the output thereof is coupled to the input of the nonlinear amplifier. The output signal of the PA is applied to the inverting input of the OA 65 via a divider comprising the resistors 66 and 67 which determine the gain of the PA. The hereinabove described short circuit protection can be also analogously applied to the transistors 70 and 71.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Power amplifier, comprising:
   a nonlinear amplifier means for amplifying an input signal of the power amplifier and providing a plurality of interim signals each having a different transfer function with respect to the input signal; and
   power amplifier means for separately amplifying each of the interim signals and providing at least a portion of an output signal of the power amplifier.

2. Power amplifier of claim 1 wherein the nonlinear amplifier means includes a plurality of diode means for determining the transfer functions of the interim signals.

3. Power amplifier of claim 2 wherein the diode means provide separate interim signals below, within and above a predetermined range according to the voltage level of the input signal.

4. Power amplifier of claim 2 wherein the nonlinear amplifier means includes a resistive means coupled in series with the input signal of the power amplifier for providing one of the interim signals, and
   further wherein one of the diode means is coupled to limit the one interim signal.

5. Power amplifier of claim 2 wherein at least one diode means includes a source means for determining a range of the respective interim signal.

6. Power amplifier of claim 5 wherein the nonlinear amplifier means includes at least one transistor having a base coupled to the input signal of the power amplifier, an emitter coupled to one source means, and a collector for providing the respective interim signal.

7. Power amplifier of claim 6 wherein the one source means includes a second diode means for compensating for a voltage between the base and emitter of the transistor.

8. Power amplifier of claim 5 wherein the source means includes means for sensing the output signal of the power amplifier.

9. Power amplifier of claim 1 wherein each power amplifier means includes at least one transistor for providing the respective portion of the output signal of the power amplifier in response to the respective interim signal, and has a gain as to prevent a saturation of the transistor.

10. Power amplifier of claim 1 further including an operational amplifier coupled in series with the input signal of the power amplifier, and having a pair of differential inputs separately receiving the input signal and at least a portion of the output signal of the power amplifier, and an output coupled to the nonlinear amplifier means.

11. Power amplifier of claim 1 wherein at least one of the power amplifier means includes a transistor having a base coupled to receive the respective interim signal, and a pair of electrodes, and
    further wherein one of the electrodes provides the respective portion of the output signal of the power amplifier.

12. Power amplifier of claim 11 wherein the power amplifier means includes a means for sensing an excessive current in one of the electrodes of the transistor and accordingly limiting the respective interim signal.

13. Power amplifier of claim 12 wherein the means for sensing and limiting includes:
    a resistive means coupled in series with the one electrode of the transistor to conduct a current therein; and
    an amplifier means for sensing an excessive voltage across the resistive means and accordingly limiting the respective interim signal.

14. Power amplifier of claim 12 wherein the means for sensing and limiting includes a means for sensing a voltage at the electrode providing the respective portion of the output signal, and accordingly determining the excessive current.

15. Power amplifier of claim 11 further including a diode means coupled in series with one of the electrodes of the transistor for preventing reverse polarity currents therein.

* * * * *